United States Patent
Beyer et al.

(10) Patent No.: US 10,518,571 B2
(45) Date of Patent: Dec. 31, 2019

(54) DIGITALLY IMAGEABLE FLEXO-PRINTING PLATE WITH INTEGRATED BARRIER LAYER

(71) Applicant: FLINT GROUP GERMANY GMBH, Stuttgart (DE)

(72) Inventors: Matthias Beyer, Pfinztal-Berghausen (DE); Armin Becker, Grossniedesheim (DE)

(73) Assignee: FLINT GROUP GERMANY GmbH, Stuttgart (DE)

( * ) Notice: Subject to any disclaimer, the term of this patent is extended or adjusted under 35 U.S.C. 154(b) by 0 days.

(21) Appl. No.: 15/577,103

(22) PCT Filed: May 24, 2016

(86) PCT No.: PCT/EP2016/061640
§ 371 (c)(1),
(2) Date: Nov. 27, 2017

(87) PCT Pub. No.: WO2016/188981
PCT Pub. Date: Dec. 1, 2016

(65) Prior Publication Data
US 2018/0170088 A1    Jun. 21, 2018

(30) Foreign Application Priority Data
May 28, 2015    (EP) ..................................... 15169554

(51) Int. Cl.
*G03F 7/20*    (2006.01)
*B41N 1/12*    (2006.01)
(Continued)

(52) U.S. Cl.
CPC ................. *B41N 1/12* (2013.01); *B41C 1/00* (2013.01); *G03F 7/0047* (2013.01); *G03F 7/092* (2013.01); *G03F 7/11* (2013.01); *G03F 7/202* (2013.01)

(58) Field of Classification Search
CPC ........................................................ G03F 7/20
See application file for complete search history.

(56) References Cited

U.S. PATENT DOCUMENTS 5,262,275 A * 11/1993 Fan ......................... G03F 7/202
                                                        430/271.1
2004/0038147 A1    2/2004 Ray
(Continued)

FOREIGN PATENT DOCUMENTS

CN    102103322 A    6/2011
EP    1 457 823 A2    9/2004
(Continued)

OTHER PUBLICATIONS http://www.lookpolymers.com/pdf/BYK-Cloisite-25A-Nanoclay.pdf : pp. 1-2 (Year: 2019).*
International Search Report dated Sep. 14, 2016, in PCT/EP2016/061640, filed May 24, 2016.

*Primary Examiner* — Chanceity N Robinson
(74) *Attorney, Agent, or Firm* — Oblon, McClelland, Maier & Neustadt, L.L.P.

(57) ABSTRACT

A digitally imageable, photopolymerizable flexographic printing element that includes, disposed one above another in order, at least a dimensionally stable support, at least one photopolymerizable, relief-forming layer having a layer thickness of 300-6000 μm, including at least one elastomeric binder, an ethylenically unsaturated monomer, and a photoinitiator or a photoinitiator system, an oxygen-blocking barrier layer which is transparent to UVA light and has a layer thickness of 0.3-5 μm, a laser-ablatable mask layer having a layer thickness of 0.3-5 μm, including at least one elastomeric binder and a material which absorbs UV/VIS (Continued)

light, and a removable outer film, wherein the at least one relief-forming layer, the barrier layer and the mask layer are soluble or dispersible in an organic solvent, and the barrier layer includes at least one oxygen-blocking binder and an oligomeric or polymeric basic adhesion component.

13 Claims, 3 Drawing Sheets

(51) Int. Cl.
*G03F 7/11* (2006.01)
*G03F 7/004* (2006.01)
*G03F 7/09* (2006.01)
*B41C 1/00* (2006.01)

(56) References Cited

U.S. PATENT DOCUMENTS

| | | | |
|---|---|---|---|
| 2006/0063109 A1* | 3/2006 | Choi | B41C 1/05 430/300 |
| 2012/0115083 A1 | 5/2012 | Vest | |
| 2016/0131979 A1* | 5/2016 | Becker | B41N 1/12 430/273.1 |

FOREIGN PATENT DOCUMENTS

| | | | | |
|---|---|---|---|---|
| JP | 2009-139598 A | 6/2009 | | |
| WO | WO-2014198809 A1 * | 12/2014 | | B41N 1/12 |
| WO | WO-2015063776 A1 * | 5/2015 | | G03F 7/11 |

\* cited by examiner

DIGITALLY IMAGEABLE FLEXO-PRINTING PLATE WITH INTEGRATED BARRIER LAYER

The present invention relates to digitally imageable flexographic printing plates for producing flexographic printing formes, which comprise a support film, an organic-soluble, photopolymerizable layer, an organic-soluble barrier layer for oxygen, an organic-soluble, laser-ablatable mask layer, and an outer film. Characteristics of the flexographic printing plates of the invention are effective, coordinated adhesion between the individual layers, and simple and reliable handling qualities on processing to form the cliche. Furthermore, the flexographic printing plates of the invention have high resolution and possess outstanding ink transfer properties.

PRIOR ART

Digitally imageable flexographic printing plates are known fundamentally. They comprise at least one dimensionally stable support film, a photopolymerizable layer, and a digitally imageable layer. The digitally imageable layer may be, for example, a laser-ablatable layer, a layer which can be written using inkjet printers or a thermographic layer, with laser-ablatable layers being the most commonplace.

Laser-ablatable layers, also called LAM (laser-ablatable mask) layers, are opaque to the wavelength of actinic light and customarily comprise a binder and also at least one IR absorber such as carbon black, for example. Carbon black also causes the layer to be opaque. A mask can be written into the laser-ablatable layer using an IR laser—that is, at the areas at which it is struck by the laser beam, the layer is decomposed and the photopolymerizable layer disposed beneath it is revealed. The laser-ablatable mask layer may be applied directly to the photopolymerizable layer, or there may be further layers between the photopolymerizable layer and the laser-ablatable mask layer, such as a blocking layer, for example. Examples of the imaging of flexographic printing elements with IR-ablative masks are disclosed in U.S. Pat. No. 5,262,275 or EP-1 069 475, for instance. Flexographic printing formes are produced from photopolymerizable, digitally imageable flexographic printing elements as follows: after a mask has been written into the digitally imageable layer, the flexographic printing element is exposed to UVA radiation through the mask. The photopolymerizable layer undergoes polymerization in the regions no longer concealed by the mask, while in the concealed regions there is no polymerization. Following exposure, the remnants of the mask are removed along with the unpolymerized fractions of the photopolymerizable layer. This removal may take place using one or more solvents or else thermally. If using organic solvents, a drying step is added, and typically the resultant flexographic printing forme is also aftertreated, by exposure to UVA and/or UVC light, for example. In the case of digitally imageable flexographic printing elements, the main exposure using UVA radiation takes place customarily in the presence of atmospheric oxygen.

The presence of oxygen at main exposure is known to have a very considerable influence on the form of the printing relief elements, especially on the form of fine halftone elements. Molecular oxygen, as is known, is a diradical and is therefore able to react with other radicals. As a result of the presence of molecular oxygen during the UV-light-initiated radical polymerization, the oxygen interrupts the radical chain reaction on the surface of the photopolymerizable layer, with the consequence that the surface of the relief elements is no longer adequately polymerized. Regions of the photopolymerizable layer that are situated further beneath the surface are less affected. In the course of the development of the layer after the polymerization, the layers which have not been sufficiently polymerized are likewise removed. The relief elements are therefore smaller than they actually ought to be, and have rounded corners. This effect is illustrated in EP 2 128 702 A1, page 15, FIG. 1, for instance.

The disruptive influence of oxygen during the exposure of flexographic printing elements ought fundamentally to be ruled out, so that the intended relief elements are polymerized fully through to the surface, and hence relatively fine details on the plate can be imaged. Furthermore, it would be desirable to be able to custom-influence the surface nature of the flexographic printing cliche, in order to improve ink transfer and ink lay.

Proposals have therefore been made to protect the photopolymerizable layer from oxygen during the main exposure. Hence it is possible in principle to carry out exposure under inert gas (see U.S. Pat. No. 8,241,835, for example) or using a vacuum frame, although such a procedure entails additional apparatus expense and/or complexity, and is therefore usually avoided.

Alternatively it has been proposed that flexographic printing plates should be exposed to UVA light of high power, by means of UV LEDs, for example (see EP 2 596 404, for instance). In this way, a very much greater number of radicals is formed in a short unit time, and the influence of the disruptive oxygen is outweighed. This procedure as well, however, entails additional apparatus and greater costs in the processing of the flexographic printing plates.

Additionally, proposals have been made to prevent the subsequent diffusion of the oxygen by laminating a blocking layer onto the flexographic printing element after it has already been imaged. For example, US 2012/0164584 describes the application of barrier layers by lamination after the laser imaging and before the areal UVA exposure. The application of an oil layer is also mentioned, alternatively.

Other proposals include exposing the flexographic printing plates through a separately produced mask film. WO 2005/101130 A1 discloses a multilayer mask film for producing flexographic printing formes. The mask film is imaged with a laser and then laminated by the lasered layer side onto the flexographic printing element. The support layer of the mask film acts as a barrier toward oxygen during the subsequent exposure to UVA radiation.

Laminating methods, such as the subsequent application of an oxygen-blocking film or the subsequent application of a pre-exposed mask film, are not advisable, however, since every lamination may give rise to defects, as a result, for example, of inclusion of dust particles or inclusion of air. Even the slightest defect, however, renders the flexographic cliche unusable. Furthermore, the laminating and/or the subsequent application of barrier layers, constitute an additional operation as part of the processing of the flexographic printing element, and are therefore extremely undesirable from the standpoint of the user.

The objective must therefore be to incorporate the barrier layer as an integral constituent into the flexographic printing plate. Flexographic printing plates with incorporated barrier layer are likewise known.

U.S. Pat. No. 5,262,275 discloses, for example, flexographic printing elements which comprise a support, a photopolymerizable layer, a barrier layer applied thereon, and a laser-ablatable mask layer applied thereon. The barrier layer is intended on the one hand to prevent the migration of components, such as of monomers, from the photopolymerizable layer into the laser-ablatable layer, and on the other hand to protect the photopolymerizable layer from atmospheric oxygen during the exposure of the flexographic printing element. Materials stated for the barrier layers are polyamides, polyvinyl alcohol, hydroxyalkylcellulose, ethylene-vinyl acetate copolymers, amphoteric interpolymers and combinations thereof. The thickness of the barrier layer is 0.25 µm to 76 µm, preferably 0.38 to 64 µm.

Flexographic printing elements of comparable construction are described in WO 2012/145111 A1. Materials proposed for the barrier layer are polyamides, polyvinyl alcohol, hydroxyalkylcellulose, polyvinylpyrrolidone, ethylene-vinyl acetate copolymers, amphoteric interpolymers, cellulose acetate butyrate, alkylcellulose, butyral, cyclic rubbers, or combinations thereof. Additionally the barrier layer is to have a diffusion coefficient for $O_2$ of less than $6.9*10^{-9}$ m$^2$/s and an optical transparency of at least 50%, preferably at least 75%. The layer thickness of the barrier layer is 1 to 100 µm, preferably 1 to 20 µm.

U.S. Pat. No. 8,492,074 B2 describes digitally imageable flexographic printing elements having a barrier layer comprising at least two different resins. Either the barrier layer is laminated on after imaging, or it may already be present as an integral constituent in the flexographic printing plate. The resins of the barrier layer are selected preferably from the group of polyvinylpyrrolidone, shellac, polyvinylbutyral, polyvinylidene chloride, or vinyl chloride copolymers.

Furthermore, descriptions are given of other digitally imageable flexographic printing plates with integral barrier layer, having a photopolymerizable layer which can be washed out in water or in aqueous solutions, the plates accordingly comprising preferably water-soluble or at least aqueously developable polymers as binders for the barrier layer and for the laser-ablatable mask layer for instance, EP 2284612 describes barrier layers composed of water-soluble polyamides, polyvinyl alcohols, polyacrylic acid, polyethylene oxide, cellulose, and cellulose derivatives. EP 1156368 describes barrier layers composed of alkali-soluble cellulose derivatives with plasticizers to flexibilize the layer. However, flexographic printing plates which can be washed out with water are of only limited usefulness for high-quality flexographic printing, since they swell in the polar ink solvents and do not allow consistent print quality.

Lastly, WO 2015/040094 describes flexographic printing plates which have a water-soluble, laser-ablatable mask layer and a water-soluble barrier layer on a photopolymerizable layer which is soluble in organic solvents. Preferred as material for the barrier layer are partially hydrolyzed polyvinyl acetate copolymers. These flexographic printing plates, though, must be washed out in a two-stage process, hence in turn entailing higher costs.

A general problem affecting flexographic printing plates of multilayer construction is the graduated adhesion needed between the individual layers. On the one hand, the outer film must be securely anchored on the laser-ablatable mask layer, since the outer film must not detach from the edge of the plate during plate transport or plate trimming. Prior to laser imaging, however, the outer film has to be removed. Removal must be possible even in the case of large formats, without particular force expended. When the outer film is removed, the laser-ablatable mask layer and the barrier layer must remain completely on the plate. These two layers, therefore, must adhere very well to one another, and the assembly of the two layers must in turn adhere very well to the photopolymerizable layer. Furthermore, the photopolymerizable layer must always remain firmly joined to the dimensionally stable support film. Particularly in the case of a layer construction composed of nonpolar layers soluble in organic solvents, it is difficult to tailor the adhesion between the individual layers of the layer assembly in the manner described. None of the patent specifications cited gives any indication of this problem or of possible solutions to the problem.

It is an object of the invention to formulate digitally imageable flexographic printing plates with integral barrier layer and laser-ablatable mask layer that can be processed using standard commercial washout media based on organic solvents. The construction of the flexographic printing plate is to be such that it can be easily imaged with standard commercial lasers and processed using all standard commercial UVA exposure units. The handling qualities of the flexographic printing plate are to be simple, trouble-free, and reliable.

The object is achieved by means of a digitally imageable, photopolymerizable flexographic printing element for producing flexographic printing formes, comprising, disposed one above another in the order stated, at least (A) a dimensionally stable support,
(B) at least one photopolymerizable, relief-forming layer having a layer thickness of 300 to 6000 µm, comprising at least one elastomeric binder, an ethylenically unsaturated monomer, and a photoinitiator or a photoinitiator system,
(C) an oxygen-blocking barrier layer which is transparent to UVA light and has a layer thickness of 0.3 to 5 µm,
(D) a laser-ablatable mask layer having a layer thickness of 0.3 to 5 µm, comprising at least one elastomeric binder and a material which absorbs UV/VIS light, and
(E) a removable outer film, characterized in that
the layers (B), (C) and (D) are soluble or dispersible in an organic solvent,
and
the barrier layer (C) comprises at least one oxygen-blocking binder and an oligomeric or polymeric basic adhesion component.

Below, the terms "flexographic printing forme" or "cliche" are used for a printing forme which has already been crosslinked and is print-ready. The terms "flexographic printing element" or "flexographic printing plate" are used, in the usual way, for the photopolymerizable starting material which is used for producing flexographic printing formes.

The flexographic printing plates of the invention comprise at least the following layers disposed one above another a dimensionally stable support (A), a relief-forming layer (B), a barrier layer (C), a laser-ablatable mask layer (D) and an outer film (E). There may of course also be further layers presents such as further adhesion layers, for example.

At the core of the invention is the composition of the barrier layer (C), which comprises at least one oxygen-blocking binder that is soluble in organic solvents, as main component, and an oligomeric or polymeric basic adhesion component as secondary constituent. The composition of this barrier layer is critical to the adhesion of the layer assembly. The flexographic printing plates of the invention can be reliably handled and can be processed using standard commercial lasers and exposure equipment. A further characteristic of the invention is that the layers (B), (C) and (D) are soluble or dispersible in organic solvents. The flexographic printing plates of the invention can be processed using standard commercial solvents for flexographic plates in standard commercial washout devices, in customary processing times, and with solvent solids contents up to the usual level. Standard commercial solvents for flexographic plates are, for example, Flexosol® (DuPont) or Nylosolv® (Flint Group). The principal component of these solvents is an apolar hydrocarbon solvent, with a moderately polar alcohol as secondary component.

Furthermore, the flexographic printing plates of the invention exhibit the desired high resolution. In a further embodiment of the invention, the barrier layer further comprises a filler, which allows the surface topography of the flexographic printing cliches to be set in a targeted way, and the ink transfer of the flexographic printing cliches to be improved significantly.

The composition of the individual layers is described in more detail below.

Dimensionally Stable Support (A)

The flexographic printing element of the invention comprises, in a manner known in principle, a dimensionally stable support. In the case of flexographic printing plates, it is usual to use dimensionally stable support films which typically have a thickness of 50 to 300 µm. The material of the support film may comprise, for example, steel or aluminum, or plastics such as, for example, polyethylene terephthalate, polybutylene terephthalate, polyethylene naphthalate or polycarbonate. Especially suitable are PET films having a thickness of 100 to 200 µm.

The dimensionally stable supports (A) may optionally have been treated with customary adhesion-promoting layers.

Photopolymerizable, Relief-Forming Layer (B)

The flexographic printing plate comprises at least one photopolymerizable, relief-forming layer (B). The photopolymerizable, relief-forming layer may be applied directly on the support. Alternatively, between the support and the relief-forming layer, there may be other layers, such as adhesion layers or elastic or compressible sublayers, for example.

The photopolymerizable, relief-forming layer (B) comprises at least elastomeric binder, an ethylenically unsaturated compound, a photoinitiator or a photoinitiator system, and also, optionally, one or more further components, examples being plasticizers, processing assistants, dyes, and UV absorbers.

Elastomeric binders for producing flexographic printing elements are familiar to the skilled person. Examples include styrene-diene block copolymers, natural rubber, polybutadiene, polyisoprene, styrene-butadiene rubber, nitrile-butadiene rubber, butyl rubber, styrene-isoprene rubber, styrene-butadiene-isoprene rubber, polynorbornene rubber or ethylene-propylene-diene rubber (EPDM). Hydrophobic binders are used with preference. Binders of these kinds are soluble in organic solvents.

The elastomer preferably comprises a thermoplastically elastomeric block copolymer of alkenylaromatics and 1,3-dienes. The block copolymers may alternatively be linear, branched or radial block copolymers. Typically they are three-block copolymers of the A-B-A type, but alternatively they may be two-block polymers of the A-B type, or polymers having a plurality of alternating elastomeric and thermoplastic blocks, e.g. A-B-A-B-A. Also possible is the use of mixtures of two or more different block copolymers. Commercial three-block copolymers frequently include certain fractions of two-block copolymers. The diene units may have 1,2 or 1,4 linkage. Block copolymers of the styrene-butadiene or of the styrene-isoprene type, and also of the styrene-butadiene-isoprene type, may be used. They are available commercially under the name Kraton©, for example. Use may also be made, moreover, of thermoplastically elastomeric block copolymers with styrene end blocks and a statistical styrene-butadiene middle block, which are available under the name Styroflex©. The block copolymers may also be wholly or partly hydrogenated, such as in SEBS rubbers, for example. Preferred elastomeric binders are three-block copolymers of the A-B-A type or radial block copolymers of the (AB)n type, in which A is styrene and B is a diene, and also statistical copolymers and random copolymers of styrene and a diene.

The total amount of elastomeric binders in the case of the relief-forming layer (B) is customarily 40 to 90 wt %, based on the sum of all constituents of the relief-forming layer, preferably 40 to 80 wt %, and more preferably 45 to 75 wt %.

The photopolymerizable, relief-forming layer (B) further comprises, in a known manner, at least one ethylenically unsaturated compound which is compatible with the binders. Suitable compounds have at least one ethylenically unsaturated double bond and are polymerizable. They are therefore referred to below as monomers. Having proven particularly advantageous are esters or amides of acrylic acid or methacrylic acid with mono- or polyfunctional alcohols, amines, amino alcohols or hydroxy ethers and hydroxy esters, esters of fumaric or maleic acid, vinyl ethers, vinyl esters or allyl compounds. The amount of monomers in the photopolymerizable, relief-forming layer (B) is in general not more than 20 wt %, based on the amount of all constituents of the photopolymerizable, relief-forming layer (B), and generally it is from 3 to 15 wt %.

The photopolymerizable, relief-forming layer (B) further comprises, in a known manner, at least one photoinitiator or photoinitiator system. Examples of suitable initiators are benzoin or benzoin derivatives, such as methylbenzoin or benzoin ethers, benzil derivatives, such as benzil ketals, acylarylphosphine oxides, acrylarylphosphinic esters, α-hydroxy ketones, polycyclic quinones, or benzophenones. The amount of photoinitiator in the relief-forming layer is generally up to 10 wt %, based on the amount of all constituents of the relief-forming layer. A preferred amount is from 2 to 8 wt %, more preferably from 3 to 6 wt %. The photoinitiator or photoinitiators here ought to have very good solubility in the relief-forming layer and ought not to display any tendency toward crystallization.

The relief-forming layer (B) may comprise plasticizers. Examples of such plasticizers are modified and unmodified natural oils and natural resins, such as high-boiling paraffinic, naphthenic or aromatic mineral oils, synthetic oligomers or resins such as oligostyrene, high-boiling esters, oligomeric styrene-butadiene copolymers, oligomeric methylstyrene copolymers, liquid oligobutadienes, liquid oligoisoprenes, or liquid oligomeric acrylonitrile-butadiene copolymers or oligomeric ethylene-propylene-diene copolymers. Preferred are polybutadiene oils, especially those having a molecular weight of 500 to 5000 g/mol, high-boiling aliphatic esters, and mineral oils. Also possible is the use of mixtures of different plasticizers. The amount of the optical plasticizers is determined by the skilled person in accordance with the desired properties for the layer. The amount is generally 0 to 50 wt %, preferably 0 to 40 wt %, of the sum total of all constituents of the photopolymerizable, relief-forming layer (B).

Furthermore, the relief-forming layer (B) may comprise further functional additives, with examples, as described in U.S. Pat. No. 8,808,968, being small amounts of phosphites, phosphines, thioethers, and amino-functional compounds. In this way it is possible to exclude the disruptive influence of atmospheric oxygen still present in the layer, and to obtain even greater resolution.

Moreover, the relief-forming layer (B) may comprise surface-active substances such as hydrophobic waxes or siliconized or perfluorinated compounds, as described in U.S. Pat. No. 8,114,566. During the drying of the flexographic printing cliche, these substances migrate from the relief layer to the surface, are repulsive with respect to the printing ink, and, in the printing process, cause reduced fouling of fine halftones and reduce the frequency with which the printing cliches have to be cleaned.

One key property of the relief-forming (B) layer is that it is soluble in the common, commercially available flexographic washout media. Commercially available washout media for flexographic printing plates are, for example, Nylosolv® from Flint Group or Flexosol® from DuPont. These washout media consist of one or more apolar hydrocarbon solvents as principal constituent and a moderately polar alcohol—for example, n-pentanol, cyclohexanol, ethylhexanol or heptyl alcohols—as secondary constituent. The relief-forming layer (B) may be processed within usual times in these washout media. Up to a solids fraction of at least 5 wt %, no fouling of the washout apparatus and no sedimentation of solids in the washout solution are observed in this case.

The thickness of the relief-forming layer (B) is generally 0.1 to 7 mm, preferably 0.5 to 4 mm, and more preferably 0.7 to 2.5 mm. The flexographic printing element of the invention may also comprise a plurality of photopolymerizable, relief-forming layers, soluble or dispersible in organic solvents, one above another. Flexographic printing elements having a multilayer construction of the photopolymerizable, relief-forming layer are likewise known to the skilled person.

Oxygen Barrier Layer (C)

Applied to the photopolymerizable, relief-forming layer (B) is an oxygen barrier layer which is transparent to UVA light and is soluble or dispersible in organic solvents.

Like the relief-forming layer (B), the oxygen barrier layer (C) is also soluble in the common, commercially available flexographic washout media. In particular, the presence of the barrier layer does not result in any substantial extension to the washout time. The extension of the washout time in direct comparison to a flexographic printing plate without barrier layer is not more than 10%. Up to a solids fraction of at least 5 wt %, no fouling of the washout apparatus and no sedimentation of solids in the washout solution are observed.

The term "transparent to UVA light" does not, of course, rule out the possibility of certain fractions of the UVA light being absorbed. In any case, however, the possibility of polymerization of the relief-forming layer (B) on areal UVA exposure of the flexographic printing element is ensured.

The barrier layer (C) has the key function of preventing the subsequent diffusion of oxygen into the relief-forming layer (B) during the full-area exposure of the flexographic printing element. The oxygen permeability of the barrier layer is in general less than 1000, preferably less than 500 $(cm^3 \times 100\ \mu m)/(m^2 \times d \times bar)$.

The barrier layer (C) comprises at least one oxygen-blocking binder and an oligomeric or polymeric basic adhesion component. A further requirement imposed on the binder of the barrier layer arises from the processing of the flexographic printing plate. In the course of the processing of the flexographic printing plate to the flexographic printing cliche, it is first of all imaged using IR lasers. This is done generally using laser apparatuses which comprise a rotating drum to accommodate the flexographic printing plate. During mount, the flexographic printing plate is bent and the surface is stretched. The subsequent areal exposure with UVA light takes place in general using flatbed exposure units, and so the flexographic printing element, after imaging, is straightened again. During mounting onto the drum, the barrier layer (C) must not tear, and, after demounting and straightening, there must be no wrinkles corrugations or other disruptive structures formed. The binders of the barrier layer (C) are therefore flexibly elastic binders.

For the barrier layer (C) it is possible in principle to use any flexibly elastic binder with which the oxygen permeability is at or below the stipulated maximum, provided the other marginal conditions are likewise met, such as transparency to UVA light and solubility in the commercially available flexographic washout media.

Suitable flexibly elastic polymers which are soluble in organic solvents and possess a sufficient oxygen blocking effect are, for example, partially hydrolyzed polyvinyl acetates having a degree of hydrolysis of between 30 and at most 80 mol %, ethylene-vinyl acetate copolymers and ethylene-vinyl alcohol copolymers, and ethylene-vinyl acetate-vinyl alcohol copolymers. Also highly suitable are cyclic acetals of polyvinyl alcohol such as polyvinylbutyral, polyvinylethyral, polyvinylformal, polyvinylpropyral, and copolymers containing two or more different vinylacetal units selected from vinylformal, vinylethyral, vinylpropyral, and vinylbutyral units. They are available commercially under the trade names Butvar© and/or Mowital©. The polyvinylacetals are always copolymers with vinyl alcohol units, since the reaction of polyvinyl alcohol to the full acetal is not complete, for statistical and steric reasons. To be precise, therefore, poly(vinylbutyral) is a poly(vinylbutyral-vinyl alcohol). Customarily, the residual OH content of the stated polyvinylacetals is between 10 and 30 wt %. Very highly suitable, for example, are vinylethyral-vinylbutyral-vinyl alcohol copolymers (poly(vinylethyral-vinylbutyral)), which are available commercially under the trade name Pioloform©.

When the stated polymers are used to formulate the barrier layer (C), the adhesion of the barrier layer (C) to the slightly tacky, relief-forming layer (B) is sufficiently high. Because of the apolar character of the barrier layer (C) binders and the resultant low forces of interaction, however, the attachment to the laser-ablatable mask layer (D) is problematic. Surprisingly it has been found that the attachment of the barrier layer (C) to the mask layer (D) is inadequate even when identical polymeric binders are used in both layers. Effective attachment of the individual layers to one another, however, is of critical importance to the handling qualities of the flexographic printing plate when being processed to the cliche. In particular, on removal of the outer film, the laser-ablatable mask layer (D) must remain completely on the barrier layer (C), which itself must remain completely on the relief-forming layer (B). If there is partial delamination of individual layer parts during removal of the outer film, the entire flexographic printing plate is rendered unusable.

Surprisingly it has been found that the adhesion of the barrier layer (C) to the laser-ablatable mask layer (D) can be improved considerably through the addition to the barrier layer of an oligomeric or polymeric basic adhesion component, and the flexographic printing plates can then be processed simply and reliably.

Examples of suitable adhesion components are copolymers or cooligomers having basic carboxylate or sulfonate functions, such as, for example, neutralized or semineutralized styrene-acrylic acid copolymers, styrene-acrylate-acrylic acid copolymers, or neutralized or semineutralized ethylene-acrylic acid copolymers, ethylene-methacrylic acid copolymers, and ethylene-acrylate-acrylic and/or methacrylic acid copolymers. Very highly suitable are oligomers and polymers having basic amino functions such as polyvinylamine or polyethylenimine. In contrast to the carboxylate-group-containing oligomers and/or polymers, the amino-group-containing oligomers and/or polymers are preferably used in nonneutralized form. The presence of a basic group appears to be essential for the adhesion.

The number-average molecular weight of the basic adhesion component ought to be at least 500 g/mol. At lower molecular weights, an improvement in adhesion may well be achieved, but it is not long-lasting, presumably because the small molecules are able to migrate into the other layers. Preference, therefore, is given to using adhesion components having a number-average molecular weight of at least 1000 g/mol and very preferably having a number-average molecular weight of at least 10 000 g/mol. The oligomeric (1000 g/mol to 10 000 g/mol) or polymeric (>10 000 g/mol) adhesion component may be linear or branched or else hyperbranched. Particularly in the case of the polyethylenimines, different degrees of branching may be present, as may be expressed by the percentage fraction of primary to secondary to tertiary amino groups.

Surprisingly, the addition of oligomeric or polymeric basic adhesion component does not adversely affect the oxygen-blocking effect of the barrier layer. The fraction of the basic adhesion component in the barrier layer, based on all components of the barrier layer (C), is from 1 to 30 wt %, preferably from 3 to 15 wt %.

In one particular embodiment of the invention, the barrier layer (C) further comprises a filler. This alters the surface of the barrier layer and gives it a typical topography which, on exposure with UVA light, can be transferred 1:1 onto the surface of the relief-forming layer (B). Since the subsequent diffusion of oxygen during the areal exposure to UVA light is excluded almost completely because of the presence of the barrier layer, it is possible in this way to reproduce custom-tailored surface roughnesses with high precision on the relief-forming layer.

Fillers suitable include inorganic fillers, such as silicates, finely ground quartz, glass particles, silicon oxides, or aluminum oxides or titanium oxides, or else natural minerals such as, for example, hydroxyapatite, talc, calcium sulfate or calcium carbonate, or pigments such as iron oxides or chromium oxides, for example. The fillers may have been surface-treated or surface-functionalized in order to ensure uniform dispersal of the filler particles in the barrier layer (C).

In one specific embodiment, organic materials such as polyethylene, polycarbonates, and poly(meth)acrylates may also be used. The filler particles may be in crosslinked or noncrosslinked form and may also have been functionalized with organic functional groups.

The shape of the fillers is arbitrary. It is possible to use round particles or crystalline particles with any desired shape. However, the shape of the particles does have a critical influence on the topography of the surface in question. Accordingly, custom-tailored surfaces can be formulated for different ink systems and different printing applications, as for example for the printing of flexible packing, for label printing, or for printing on paper, cardboard or corrugated board.

The operation of impressing the topography of the barrier layer (C) onto the relief-forming layer (B) may differ in profile depending on the surface functionality of the particular filler particles. If, for example, a filler has been functionalized with ethylenically unsaturated groups on the surface, then the filler particles will react with the monomers of the relief-forming layer in the course of the areal UVA exposure. Consequently, the filler will be transferred into the relief-forming layer. This process can be demonstrated analytically using micrographs. The filler particles are then standing proud from the surface of the flexographic cliches. The topography is transferred.

Unfunctionalized fillers, in contrast, will not be incorporated into the relief-forming layer, but instead only pressed mechanically into the soft, relief-forming layer. The filler particles are removed as well when the relief is washed out. Consequently, corresponding indentations or holes are observed later on the printing cliche. The topography of the barrier layer (C) is only modeled.

It is not possible to make a general prediction as to which process should be preferred for an optimum printing outcome. Different topographies may have entirely different effects with different printing ink systems and printing applications. Fundamentally, however, a flexographic printing plate of the invention ought either to model or to transfer the topography. A partial transfer and partial modeling is not helpful for consistent surface quality.

It may be pointed out that the transfer or modeling of the surface topography of the barrier layer (C) onto the relief-forming layer (B) takes place 1:1 only when the barrier layer has the required low oxygen permeability. If other polymers, with higher oxygen permeability, are used as binders for the barrier layer, then the oxygen which diffuses subsequently in the course of UVA exposure prevents the surface of the relief-forming layer being crosslinked. In that case the topmost layer is also removed during washout, and so the topography is not transferred or modeled, respectively, in 1:1 fashion.

The transfer or modeling of the topography must take place uniformly onto all relief elements, full areas and fine halftone dots. This is accomplished particularly if the binders used are the binders of the invention with low oxygen permeability. The transfer or modeling of the topography is particularly successful if the binders used are the polyvinylacetals of the invention and the fillers are inorganic silicates and/or silicon dioxide.

The average particle size of the fillers is in the range from 2 to 15 µm, preferably from 3 to 8 µm. The fraction of the inorganic fillers in the barrier layer is in a range from 5 to 30 wt %. At higher proportions, the transparency of the barrier layer will be reduced too greatly. At lower proportions, microscopically uniform roughness will not be achieved. Where organic fillers are used, the refractive index can be harmonized between filler and matrix polymer, and so in this case it is also possible for higher filler fractions (up to 50 wt %) to be realized.

The addition of a filler to the barrier layer (C) normally causes the latter to become stiffer and tack-free, resulting in reduced adhesion, thus exacerbating the above-described adhesion problems between barrier layer (C) and mask layer (D). With this embodiment, therefore, it is particularly important to use an oligomeric or polymeric basic adhesion component in the barrier layer (C).

Generally speaking, the oxygen-blocking binder barrier layer (C) comprises
50 to 99 wt %, preferably 65% to 95 wt %, of the oxygen-blocking binder, 1 to 30 wt %, preferably 3 to 15 wt %, of the basic adhesion component, and 0 to 50 wt %, preferably 1 to 30 wt %, of fillers.

The layer thickness of the barrier layer (C) is generally 0.3 µm to 5 µm. At layer thicknesses below 0.3 µm it is difficult to achieve homogeneous, uniform application and a sufficiently uniform oxygen barrier effect. At layer thicknesses of more than 5 µm, the reproduction accuracy may be reduced as a result of increasing scattering effects on the part of the UVA light, and the extensibility of the layer is adversely affected. Preferably, therefore, the layer thickness is 0.5 µm to 3 µm, more preferably 1 µm to 2 µm. The layer thicknesses can be measured by means, for example, of micrographs of a section, or alternatively they may be calculated from the application weight and the density of the applied material.

Laser-Ablatable Mask Layer (D)

Applied to the barrier layer (C) is a laser-ablatable mask layer (D) which is soluble or dispersible in organic solvents. The information to be printed is written into the laser-abatable mask layer (D) using a suitable laser.

The mask layer (D) comprises at least one elastomeric binder which is soluble in organic solvents, and components which absorb UV-VIS light.

The solubility of the mask layer is subject to the same observations as for the solubility of the barrier layer. The presence of the mask layer does not substantially prolong the washout of the flexographic printing plates of the invention in standard commercial washout media.

The mechanical requirements concerning the binders of the mask layer also correspond to the mechanical requirements concerning the binders of the barrier layer. During bending/stretching, the mask layer must not tear and it must not form wrinkles or corrugations on straightening. Generally, therefore, the binders are flexibly elastic.

The binder of the barrier layer may be identical to the binder of the mask layer, but it may also be different.

Highly suitable flexible elastic binders for the mask layer are, for example, ethylene-vinyl acetates, flexibly elastic polyamides, flexibly elastic polyurethanes, nitrocellulose, polyvinylacetals such as, for example poly(vinybutyral-vinyl alcohol) copolymers (Butvar®, Mowital®) or poly(vinylbutyral-vinylethyral-vinyl alcohol) copolymers (Pioloform®). It is of course also possible to use other flexibly elastic materials as binders, such as partially hydrolyzed polyvinyl acetates, for example. A preferred binder for the mask layer is the flexibly elastic polyamide Makromelt® 6900.

Besides the binder, the laser-ablatable mask layer (D) comprises UV/VIS-light-absorbing materials, with the layer thickness and/or the amount of the light-absorbing materials being generally such that the optical density of the layer for UVA radiation is 1 to 5. The UVA radiation range embraces light with wavelength of 300 to 400 nm. The optical density is the logarithmic coefficient for the light intransmissibility of the layer within this wavelength range. On measurement of the optical density, therefore, the value determined is not an individual value of the light intransmissibility at a particular wavelength, but rather an average value of the light intransmissibilities in a defined wavelength range. The optical density is normally measured using commercially available densitometers (e.g., from x-rite), with the wavelength range being selected prior to measurement. For the purposes of the invention, all cited optical density measurement values are based on the UVA range, i.e., the range from 300 to 400 nm.

Preferred optical densities of the mask layer (D) are in the range from 2 to 5. The high optical density ensures that the regions of the relief-forming layer (B) that are covered by the mask do not polymerize during the full-area exposure to UVA light. Suitable light-absorbing material includes, in particular, finely divided carbon black, graphite, carbon black nanoparticles or carbon nanotubes. These materials absorb very well in the near IR range and hence ensure rapid image generation on imaging by means of IR lasers, such as, for example, IR laser diodes (830 nm) or Nd:YAG lasers (1064 nm). Of course, the laser-ablatable mask layer (D) may alternatively comprise other UV or IR absorbers on a pigment basis, or soluble dyes. Examples of dyes which can be used are phthalocyanines and substituted phthalocyanine derivatives, cyanine and merocyanine dyes, or else polymethine dyes or azo dyes.

The disadvantage of the molecular, soluble dyes is that they can diffuse from the laser-ablatable mask layer into other layers of the flexographic printing element, thereby reducing the optical density of the mask layer and increasing that of the other layers, resulting in an extension to the processing times of the flexographic printing plate over the storage period. Furthermore, the quality of the cliches produced is diminished. For this reason, preference is given to pigment-based UV and IR absorbers such as carbon black, graphite, and carbon nanoparticles or carbon nanotubes.

The amount of the light-absorbing materials is generally 10 wt % to 60 wt %, based on the amount of all components of the laser-ablatable mask layer.

Furthermore, the laser-ablatable mask layer (D) may optionally also comprise plasticizers, stabilizers or other assistants, examples being emulsifiers, flow control assistants or UV absorbers. These materials, however, must have a molar mass high enough to prevent diffusion into other layers of the flexographic printing element, on the basis of the molecular size, or the diffused materials in the other layers are without influence or function and so also do not disrupt the production of the flexographic printing cliche.

The layer thickness of the laser-ablatable mask layer (D) is generally preferably 0.3 µm to 5 µm. At layer thicknesses below 0.3 µm, it is difficult to achieve a sufficient optical density. At layer thicknesses of more than 5 µm, the laser sensitivity of the element is too low, and so long laser times are required for imaging. The laser sensitivity of the mask layer (measured as the energy needed in order to ablate 1 cm$^2$ of layer) ought to be between 0.5 and 4 mJ/cm$^2$. The layer thickness is preferably 1 µm to 3 µm.

Outer Film (E)

As their topmost layer, the flexographic printing plates of the invention comprise a removable outer film (E), whose purposes include that of protecting the flexographic printing plate. The outer film is removed before the flexographic printing plate is imaged by means of the IR laser. Particularly suitable removable outer films (E) are PET films with moderate or low roughness. Typical individual averaged roughness depths (Rz) ought to be between 0.2 and 2.0 µm. The mean roughness values (Ra) ought to be between 0.02 and 0.5 µm.

The roughness of the outer film is important for the removal of the outer film from the assembly composed of support film, relief-forming layer, barrier layer, and mask layer. The rougher the outer film, the greater the area of contact between outer film and mask layer, and the greater the forces which must be expended on removal of the outer film. A smooth film is therefore preferential for reliable handling.

A smooth outer film has the further advantage that the application rate of the laser-ablatable mask layer can be reduced, hence increasing the laser sensitivity. This is not possible in the case of a rough outer film, since all of the ridges in the outer film must be filled in completely, and all peaks covered, so that a high optical density is achieved over the entire area and no holes occur. For example, a Mylar® A PET film can be used.

Production of the Flexographic Printing Plates of the Invention

The flexographic printing plates of the invention are produced in a manner known in principle, by melting the components of the photopolymerizable layer in an extruder, mixing them, and discharging the melt of the photopolymerizable material through a slot die into the nip of a calender. Running in over one calender roll is a support film, which is optionally coated with further layers, such as an adhesion layer, for example, and running in via the other calender roll is a prefabricated outer element. The layer assembly composed of dimensionally stable support film (A), photopolymerizable layer (B) and outer film (E) with the layers (D) and (C) is joined together by calendering.

The outer element is the outer film (E), which has already been coated with the laser-ablatable mask layer (D) and the barrier layer (C).

In the production of the outer element, the laser-ablatable mask layer (D) is first applied to the outer film (E). This application procedure may take place from solution, from the melt, or by spraying. The laser-ablatable mask layer (D) is subsequently overlaid with the barrier layer (C).

In order to prevent partial dissolution of the first, already applied mask layer (D) on overlaying with the barrier layer (C), it may be necessary to vary the solvent composition of the casting solutions. Prior to application of each subsequent layer, it may be necessary for the surface to be coated to be partially crosslinked by electron beams, in order to achieve greater capacity for overlaying. A corona pretreatment of the initially applied mask layer may also be useful in order to achieve better attachment of the layers among one another. As a restriction, it must be stated that the effects of a corona pretreatment often subside over the storage time of the printing plate, and a permanently satisfactory adhesion is not achieved.

Alternatively, the individual layers may also be coated separately onto different films and then laminated together. For example, the mask layer (D) and the barrier layer (C) may also be coated separately each onto one film. In this case the mask layer (D) is applied to what later is the outer film (E), whereas the barrier layer (C) is applied to a temporary auxiliary film. After coating has taken place, the two films are laminated to one another by the layer sides, and the temporary auxiliary film is removed.

Casting technologies for applying layers are known to the skilled person. The thickness of the layers to be applied may be reduced in a manner known in principle by diluting the casting solution and/or altering the coating parameters such as knife gap or coating speed. In order to improve coating quality, it may be necessary to add surface-active substances or flow control assistants to the coating solution.

The coated outer element is rolled up and is run in over one of the calender rolls during the subsequent extrusion, and is in this way firmly joined to the photopolymerizable, relief-forming layer (B).

Alternatively, parts of the outer element may also be laminated on in a plurality of steps. For example, an outer element composed of a barrier layer (C) on a temporary auxiliary film may be run in over the calender rolls and joined to the photopolymerizable layer (B). The auxiliary film is subsequently removed. Then, in a second laminating step, the laser-ablatable mask layer (D) is laminated with the actual outer film. The adhesion between barrier layer and laser-ablatable mask layer then builds up in the subsequent days. It is fundamentally the case that the adhesion of the printing plates of the invention is constant only after a storage time of two weeks, and adhesion measurements ought not to be carried out until after such time.

Processing of the Flexographic Printing Elements of the Invention into Flexographic Printing Formes The production of flexographic printing formes from the flexographic printing elements of the invention comprises the method steps (i) to (vi):

(i) removing the outer film (E),
(ii) writing a mask into the laser-ablatable mask layer (D) by means of an IR laser,
(iii) exposing the imaged flexographic printing element to UVA light through the resultant mask,
(iv) removing the remnants of the laser-ablatable mask layer (D), the barrier layer (C), and the unpolymerized fractions of the relief-forming layer (B), using a flexographic washout medium,
(v) drying the resultant flexographic printing plate, and
(vi) optionally post-exposing the dried flexographic printing plate to UVA and/or UVC light.

The invention also provides a method for producing flexographic printing formes from the flexographic printing elements of the invention, comprising the method steps (i) to (vi). Additionally provided by the invention are the flexographic printing formes themselves thus produced.

In method step (i), the outer film (E) is removed from the flexographic printing element. Here, the laser-ablatable mask layer (D) and the barrier layer (C) must remain completely on the relief-forming layer (B). This is readily possible with the flexographic printing elements of the invention.

In method step (ii), a mask is written into the laser-ablatable mask layer (D) using an IR laser. Laser apparatuses for writing masks are known to the skilled person and are available commercially. In principle it is possible to use all standard commercial lasers (predominantly external drum lasers). During mounting on the laser drum, the flexographic printing elements are stretched. In this procedure, the barrier layer (C) and the laser-ablatable layer (D) must not tear, something which is readily possible with the flexographic printing elements of the invention.

In method step (iii), the imaged flexographic printing element is exposed to areal UVA radiation through the resulting mask and through the barrier layer (C). Exposure causes the photopolymerizable layer to undergo polymerization in the regions no longer concealed by the mask, whereas no polymerization takes place in the concealed regions. During exposure, the photopolymerizable layer is protected by the barrier layer (C) from the effects of subsequently diffusing oxygen. Exposure can therefore take place with standard commercial UVA tube exposure units or UV-LED strips. Costly and inconvenient exposure in the absence of air, or the costly and inconvenient application of a film by lamination, or the application of an oxygen-blocking film by lamination, are unnecessary when using the flexographic printing elements of the invention.

In method step (iv), the remnants of the laser-ablatable mask layer (D), and the barrier layer (C), and also the unpolymerized fractions of the relief-forming layer (B) are removed, within customary processing times, using commercially available flexographic washout media. This may be done using customary washout equipment, more particularly using flatbed washout equipment. Preference is given to using a washout medium which comprises at least one organic solvent.

Commercially available flexographic washout media are described for example in EP 332 070. In general they comprise aliphatic, cycloaliphatic or aromatic hydrocarbons and one or more alcohols. The majority of washout media used on the market comprise nonpolar hydrocarbons as a principal component, and also alcohols of medium polarity in an amount of 10 to 30 wt %. Examples of commercial washout media comprise mixtures containing about 40 wt % of high-boiling hydrocarbon solvents, about 40 wt % of decalin, and about 20 wt % of n-pentanol, mixtures containing about 50% of high-boiling hydrocarbon solvents, about 20 wt % of diisopropylbenzene, and about 30 wt % of cyclohexanol; mixtures containing about 56 wt % of decalin, about 27 wt % of aliphatic hydrocarbon solvent, about 12 wt % of benzyl alcohol, and about 2 wt % of ethylhexanol; and mixtures containing about 70 wt % of aromatic hydrocarbons and about 30 wt % of heptyl alcohols.

Alternatively, the flexographic printing elements of the invention may also be developed thermally. In that case the flexographic printing elements are mounted onto a drum and heated from the surface until melting occurs. A fabric strip is then pressed onto the flexographic printing elements, and the unexposed regions of the relief-forming layer, the barrier layer, and the remnants of the laser-ablatable mask layer are removed. This operation is repeated a number of times until the desired depth of relief has been reached.

In method step (v), optionally, the resulting flexographic printing plate is dried, in a manner known in principle, and in method step (vi) it is post-exposed, in a manner known in principle, using UVA and/or UVC light.

The method may of course optionally comprise further method steps as well. For example, preliminary exposure may be carried out before or after the writing of the mask using IR lasers. In that case the flexographic printing elements of the invention are exposed through the support film, thereby generating a uniform relief base allowing the height of the desired relief to be adjusted.

EXAMPLES

Production of the Flexographic Printing Plates of the Invention

In the examples, the following components were used:
Makromelt® 6900, a flexibly elastic polyamide from Henkel.
Spezial Schwarz 4, an amorphous carbon black from Evonik.
Mowital® B16H, a polyvinylbutyral having a residual OH content of 19.5%, from Kuraray.
Pioloform® BL16, a poly(vinylbutyral-vinylethyral) copolymer having a residual OH content of 16%, from Kuraray.
Loxanol® MI 6735, a polyethylenimine having a molecular weight of 25 000 g/mol, from BASF.
Lupasol® P, a polyethylenimine having a molecular weight of 750 000 g/mol, from BASF.
Syloid® ED 3, an amorphous silicon dioxide having an average particle size of 5.8 µm, from Grace.

The invention is described in more detail in the examples which follow. The experiments were carried out on the industrial scale, meaning that large-format flexographic printing plates in 1270 mm×2032 mm format were produced. The starting material used was a Flint Group Nyloflex® NEF 114 D flexographic printing plate. All % figures should be understood as proportional percentages by weight.

The components of the relief-forming layer of the Nyloflex® NEF flexographic printing plate were mixed and melted in a ZSK twin-screw extruder. The melt was discharged at a temperature of 130° C. through a slot die and run into a calender. Run in over the upper calender roll was a PET outer film which had been coated beforehand with the laser-ablatable mask layer and with the barrier layer. Run in over the lower calender roll was a PET support film. The assembly was taken off via a vacuum suction belt, cooled down and cut into the desired plate format of 1270 mm×2032 mm. The overall thickness of the flexographic printing plate was 1.27 mm. After a storage time of two weeks, the flexographic printing plates were subjected to measurement and were processed further into flexographic printing cliches.

All experiments used an outer film comprising a 0.1 mm thick PET film of Mylar® A type. Applied atop this outer film in each case was a laser-ablatable mask layer. The mask layer contained 65% of Makromelt© 6900 and 35% of Spezial Schwarz 4. To produce the layer, the Makromelt© 6900 was dissolved in a solution consisting of equal parts of toluene and n-propanol. The Spezial Schwarz 4 was subsequently added in portions and the solution was passed through a ball mill for five hours. The solids content of the dispersion was 12%. The dispersion was subsequently coated onto the Mylar® A film via a doctor roll, and dried at 75° C. The dry application weight of the layer was 2.9 g/m² and the optical density across the entire coating width was in a range from 3.7 to 4.0.

The outer film coated with the mask layer was subsequently overlaid with the barrier layer. The composition of the respective barrier layers is contained in the following table.

| Experiment number | Barrier layer components | Fractions in wt % |
|---|---|---|
| VV1 (Comparative) | — | — |
| VV2 (Comparative) | Mowital B16H | — |
| V1 | Mowital B16H | 93 |
|  | Loxanol MI6735 | 7 |
| V2 | Mowital B 16H | 91 |
|  | Lupasol P | 9 |
| V3 | Pioloform BL16 | 95 |
|  | Lupasol P | 5 |
| V4 | Pioloform BL16 | 77 |
|  | Loxanol MI 6735 | 7 |
|  | Syloid ED 3 | 16 |
| V5 | Pioloform BL16 | 71 |
|  | Loxanol MI6735 | 9 |
|  | Syloid ED3 | 20 |

To produce the barrier layer (C), the binder was dissolved in a solvent mixture consisting of 20% of water and 80% of isopropanol at room temperature. Thereafter the adhesion component and optionally the filler were added, and the solution or dispersion was stirred for 30 minutes. The solids content of the coating solution was 12%. The coating solution was subsequently applied to the mask layer via a doctor roll and dried at 65° C. The dry application weight of the layer was 2.8 g/m².

The outer films twice coated in this way were subsequently run as described above into the calender and in that way were joined firmly to the relief-forming layer of the flexographic printing plate.

Processing of the Flexographic Printing Plates of the Invention into Flexographic Printing Cliches, and Printing After a storage time of two weeks, the flexographic printing plates were processed to the cliche and evaluated. The flexographic printing plates were first of all subjected to preliminary reverse exposure for around 30 seconds (Nyloflex® F V exposure unit, Flint Group).

Then the outer film was removed. The removal of the outer film was evaluated statistically. For this purpose, the outer film was removed manually from batches of ten large-format plates, and the printing plates were inspected for instances of detachment on the edges and angles. The number of defect-free plates was recorded.

Additionally, determinations were made of the adhesion of the outer film and the adhesion of the laser-ablatable mask layer to the underlying barrier layer. The adhesion measurements were made on strips 4 cm wide, on a Zwick tension-extension testing machine.

The flexographic printing plates were then mounted onto the drum of an IR laser (CDI® Spark 4835 from Esko) and imaged with a suitable motif using a resolution of 2540 dpi. The test motif included a halftone wedge with graduated tonal values (1% to 5% halftone fields at a distance of 0.2%) with a resolution of 146 lpi.

The plate thus prepared was subsequently exposed to UVA radiation for 14 minutes (Nyloflex® F V exposure unit, Flint Group) and then developed.

The solvent-based developing of the image wise-exposed flexographic printing plates was carried out at the particular specified washout speed and with the brush position recommended for the specific type of product, using a Nyloflex® F V washout apparatus from Flint Group. The washout medium used was Nylosolv® A from Flint Group, a commercial flexographic washout medium composed of about 70% hydrocarbon solvents and about 30% alcohol. After the washout operation, the cliches, which still contained solvent, were dried at 60-65° C. for 120 minutes in line with the product-specific recommendations, and then underwent post-exposure in the post-exposure unit of a Nyloflex® F V exposure unit, using UVA and UVC light. The flexographic cliches were evaluated under a microscope, and a determination was made of the smallest halftone tonal value which was imaged flawlessly on the flexographic cliche. The depth of relief was determined as well.

The flexographic cliches were subsequently used for printing, with the following printing parameters:
Printing machine: W&H central cylinder machine
Substrate: White PE film
Printing ink: Flexistar Cyan alcohol-based flexographic printing ink
Adhesion tape: Lohmann 5.3
Printing speed: 100 m/min
Print setting: optimum (+70 µm via kissprint setting)

The optical density of a printed solid area was determined from the print specimens.

The results of the adhesion measurements, and also the results of evaluation of cliche and printing, are summarized in the table below.

| Experiment | Outer film adhesion (cN/4 cm) | Mask layer adhesion (cN/4 cm) | Statistical removal test* | Depth of relief (µm) | Smallest stable tonal value at 146 lpi(%) | Masstone density (OD) |
|---|---|---|---|---|---|---|
| VV1 | 13.9 | 87.1 | 10 | 820 | 3.8 | 1.50 |
| VV2 | 14.5 | 22.1 | 1 | 820 | 1.6 | 1.53 |
| V1 | 15.8 | 88.7 | 10 | 790 | 1.4 | 1.50 |
| V2 | 16.4 | 104 | 10 | 810 | 1.4 | 1.54 |
| V3 | 17.4 | 44.0 | 9 | 800 | 1.6 | 1.55 |
| V4 | 15.7 | 67.1 | 10 | 820 | 1.6 | 1.74 |
| V5 | 25.6 | 148.5 | 10 | 800 | 1.4 | 1.69 |

*)Number of defect-free plates on removal of the outer from batches of ten plates The results impressively demonstrate the increase in the adhesion values as a result of adding the basic adhesion component. Only in the case of V3, with a relatively low proportion of 5% of the adhesion component, is there no particularly pronounced increase in adhesion.

The adhesion values correlate with the results of the statistical outer film removal test. Comparative experiment VV1 without a barrier layer exhibits good adhesion. The outer film is removed without problems. Comparative experiment VV2, with barrier layer but without adhesion component, exhibits weak adhesion of the mask layer to the underlying barrier layer and, correspondingly, a very poor removal result. The outer film could be removed without defects only from one plate out of ten. Conversely, all of the other experimental formulations with barrier layer with adhesion component gave very good results in the removal test.

The depths of relief of all the experimental formulations are unremarkable. This is evidence that the additional barrier layer does not adversely affect washout. The oxygen block effect is pronounced in the case of the flexographic printing plates with a barrier layer. Halftone tonal values of 1.4% or 1.6% can be imaged flawlessly on the plate. The flexographic plate without a barrier layer (VV1), in contrast, is able only to hold a very small tonal value of 3.8% on the cliche. The high ink density achieved in experiments V4 and V5 is remarkable. These experiments contain an inorganic filler in the barrier layer, which makes the barrier layer rough. This roughness is modeled onto the surface of the flexographic cliche, resulting in considerably improved ink transfer in the print.

Figure 1:
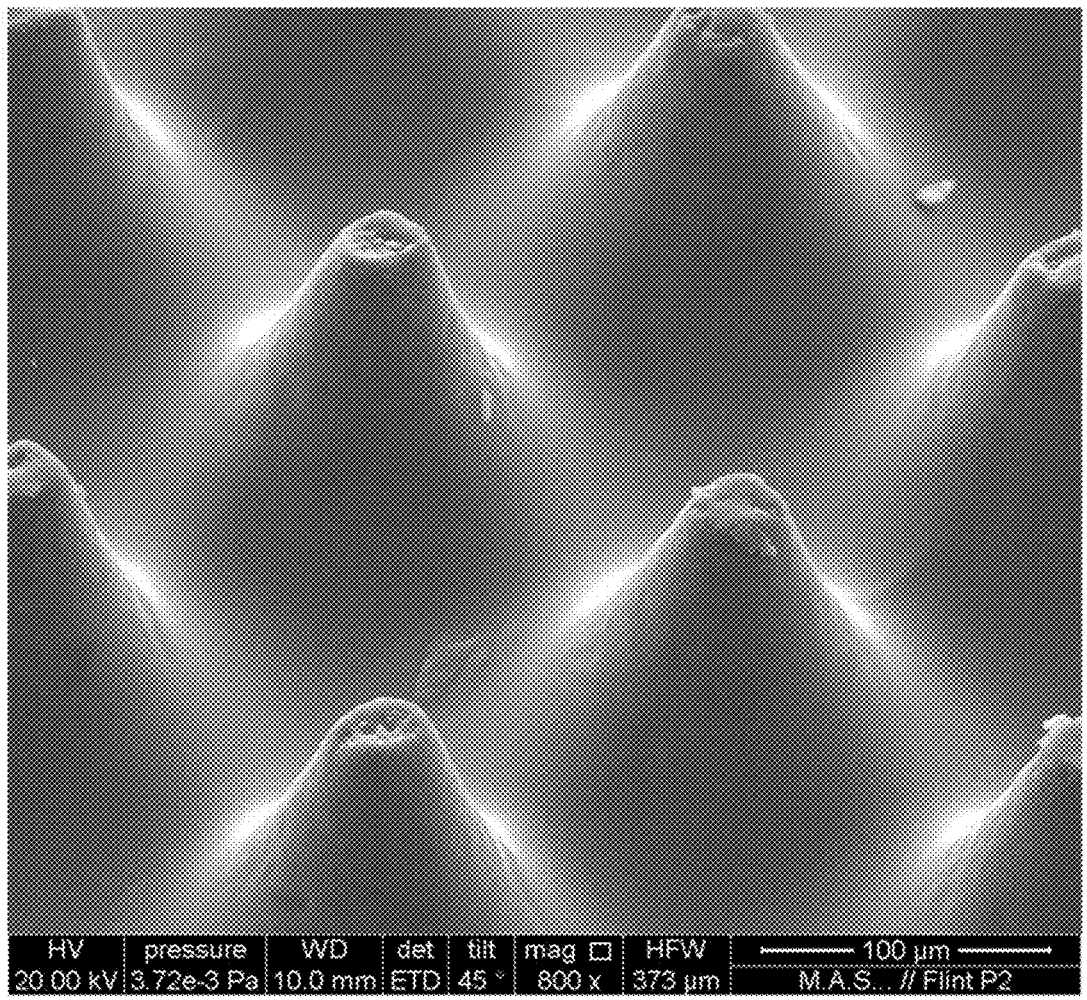
FIG. 1 shows an electron micrograph of halftone dots of a flexographic cliche according to V5. The halftone dots correspond to a tonal value of 2% at 146 lpi (lines per inch).
Figure 2:
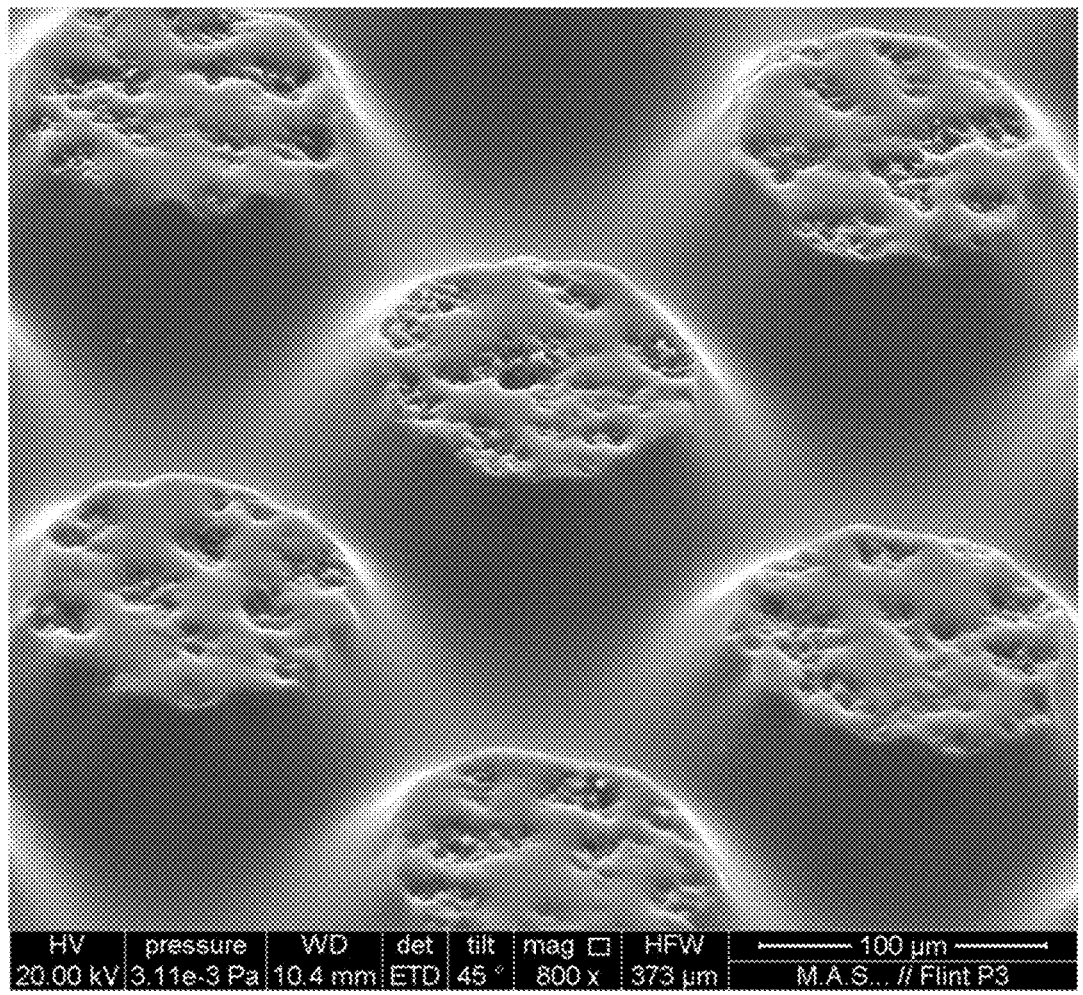
FIG. 2 shows an electron micrograph of halftone dots of a flexographic cliche according to V5. The halftone dots shown correspond to a tonal value of 30% at 146 lpi (lines per inch).
Figure 3:
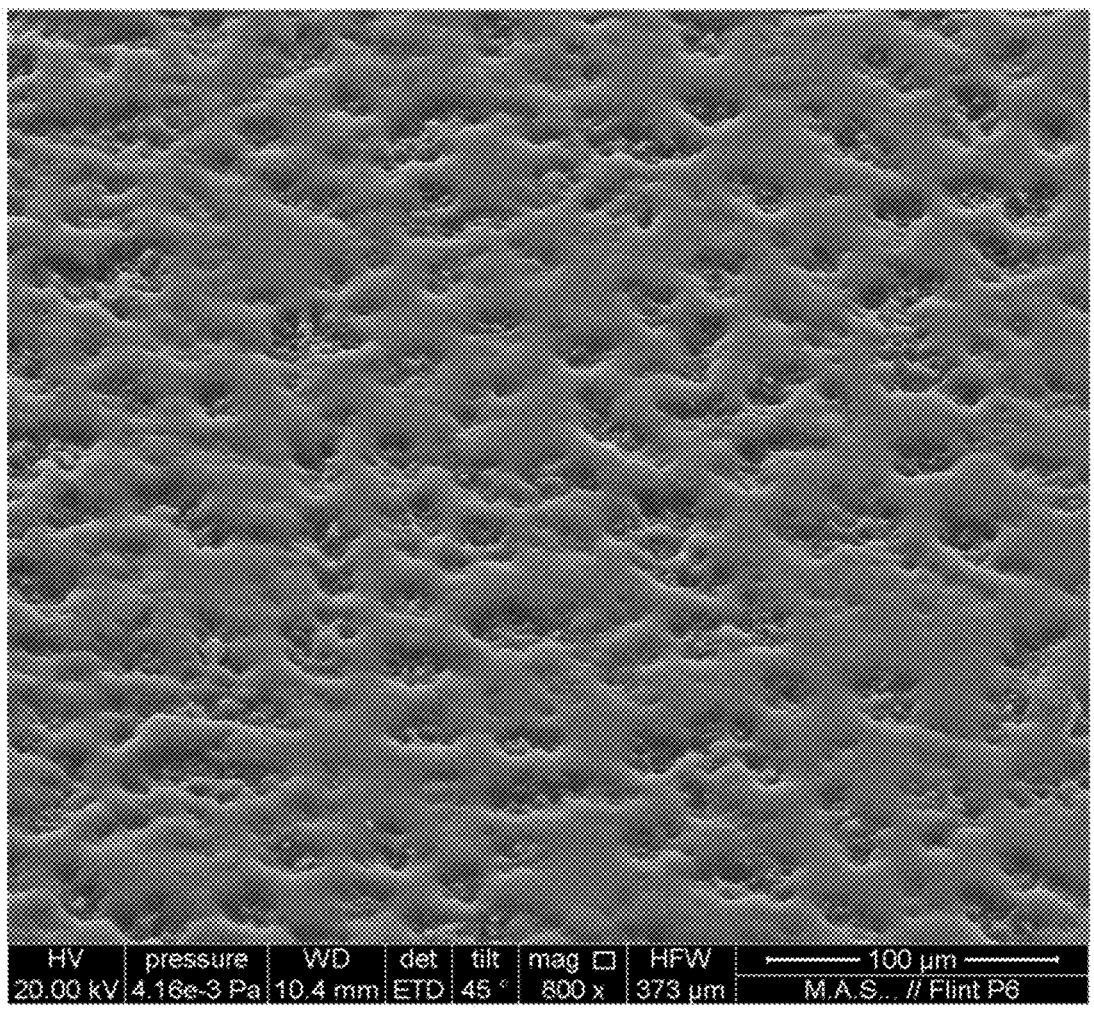
FIG. 3 shows an electron micrograph of a solid area of a flexographic cliche according to V5.

The electron micrographs of the flexographic cliche from V5 (FIGS. 1 to 3) impressively demonstrate that the roughness of the barrier layer is modeled onto the surface of the flexographic cliche. The surface exhibits indentations and/or holes, which are responsible for the improved ink transfer. The roughness is transmitted not only onto the areal elements of the flexographic cliche (see FIG. 3), but also onto the surfaces of the fine halftone dots (FIGS. 1 and 2). This is possible only by the barrier layer of the invention completely preventing the subsequent diffusion of oxygen.

What is claimed is:

1. A digitally imageable, photopolymerizable flexographic printing element comprising, disposed one above another in order, at least
    (A) a dimensionally stable support,
    (B) at least one photopolymerizable, relief-forming layer having a layer thickness of 300 to 7000 μm, comprising at least one elastomeric binder, an ethylenically unsaturated monomer, and a photoinitiator or a photoinitiator system,
    (C) an oxygen-blocking barrier layer which is transparent to UVA light and has a layer thickness of 0.3 to 5 μm,
    (D) a laser-ablatable mask layer having a layer thickness of 0.3 to 5 μm, comprising at least one elastomeric binder and a material which absorbs UV/VIS light, and
    (E) a removable outer film,
    wherein:
    the layers (B), (C) and (D) are soluble or dispersible in an organic solvent,
    the barrier layer (C) comprises at least one oxygen-blocking binder and an oligomeric or polymeric basic adhesion component,
    the elastomeric binder of the laser-ablatable mask layer (D) is at least one selected from the group consisting of a polyamide, a polyvinyl acetate, an ethylene-vinyl acetate copolymer, a partially hydrolyzed polyvinyl acetate, a polyurethane, a nitrocellulose, and a polyvinylacetal,
    the basic adhesion component of the barrier layer (C) is an oligomeric or polymeric polyvinylamine or polyethylenimine.

2. The digitally imageable, photopolymerizable flexographic printing element of claim 1, wherein the oxygen-blocking binder of the barrier layer (C) comprises a partially hydrolyzed polyvinyl acetate having a degree of hydrolysis of 10 to 75 mol %.

3. The digitally imageable, photopolymerizable flexographic printing element of claim 1, wherein the oxygen-blocking binder of the barrier layer (C) comprises a polyvinylacetal.

4. The digitally imageable, photopolymerizable flexographic printing element of claim 3, wherein the polyvinylacetal is at least one selected from the group consisting of polyvinylformal, polyvinylethyral, polyvinylpropyral, polyvinylbutyral, and poly(vinylethyral-vinylbutyral).

5. The digitally imageable, photopolymerizable flexographic printing element of claim 1, wherein the barrier layer (C) further comprises a filler.

6. The digitally imageable, photopolymerizable flexographic printing element of claim 5, wherein the filler is $SiO_2$ or a silicate.

7. The digitally imageable, photopolymerizable flexographic printing element of claim 5, wherein the filler has an average particle size of 1 to 10 μm.

8. The digitally imageable, photopolymerizable flexographic printing element of claim 1, wherein the oxygen-blocking barrier layer (C) comprises
    50 to 99 wt % of the oxygen-blocking binder,
    1 to 30 wt % of the basic adhesion component, and
    0 to 50 wt % of fillers.

9. The digitally imageable, photopolymerizable flexographic printing element of claim 1, wherein the oxygen-blocking barrier layer comprises 1 to 30 wt % of fillers.

10. The digitally imageable photopolymerizable flexographic printing element of claim 1, wherein the material which absorbs UV-VIS light in the mask layer (D) is at least one selected from the group consisting of carbon black, graphite, carbon nanoparticles, and carbon nanotubes.

11. A method for producing a flexographic printing plate from the digitally imageable, photopolymerizable flexographic printing element of claim 1, comprising (i) to (vi):
    (i) removing the outer film (E),
    (ii) writing a mask into the laser-ablatable mask layer (D) with an IR laser,
    (iii) exposing the imaged flexographic printing element to UVA light through the resultant mask,
    (iv) removing the remnants of the laser-ablatable mask layer (D), the barrier layer (C), and the unpolymerized fractions of the relief-forming layer (B), using a washout medium,
    (v) drying the resultant flexographic printing plate, and
    (vi) optionally post-exposing the dried flexographic printing plate to UVA and/or UVC light.

12. The method of claim 11, wherein the washout medium in (iv) comprises aliphatic, cycloaliphatic or aromatic hydrocarbons and one or more alcohols.

13. The digitally imageable, photopolymerizable flexographic printing element of claim 5, wherein the filler has an average particle size of 2 to 6 μm.

* * * * *

UNITED STATES PATENT AND TRADEMARK OFFICE
CERTIFICATE OF CORRECTION

PATENT NO. : 10,518,571 B2
APPLICATION NO. : 15/577103
DATED : December 31, 2019
INVENTOR(S) : Matthias Beyer et al.

Page 1 of 1

It is certified that error appears in the above-identified patent and that said Letters Patent is hereby corrected as shown below:

On the Title Page

Item (71), the Applicant's name is incorrect. Item (71) should read:
-- (71) Applicant: FLINT GROUP GERMANY GmbH, Stuttgart (DE) --

Signed and Sealed this
Eighteenth Day of February, 2020

Andrei Iancu
*Director of the United States Patent and Trademark Office*